(12) United States Patent
Naka et al.

(10) Patent No.: US 6,182,675 B1
(45) Date of Patent: Feb. 6, 2001

(54) APPARATUS FOR RECOVERING IMPURITIES FROM A SILICON WAFER

(75) Inventors: Jiro Naka; Naohiko Fujino; Noriko Hirano; Junji Kobayashi; Kazuo Kuramoto, all of Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/030,818

(22) Filed: Feb. 26, 1998

(30) Foreign Application Priority Data

Feb. 28, 1997 (JP) .......................................................... 9-45680

(51) Int. Cl.⁷ .................................. B08B 3/02; B08B 3/04
(52) U.S. Cl. ........................ 134/61; 134/95.2; 134/95.3; 134/104.4; 134/157; 134/902
(58) Field of Search ............................... 134/104.4, 902, 134/157, 198, 104.2, 61, 66, 95.2, 95.3, 135; 118/423, 416, 52, 319

(56) References Cited

U.S. PATENT DOCUMENTS

| | | | |
|---|---|---|---|
| 4,350,174 | * | 9/1982 | Bolten et al. .......................... 134/104 |
| 4,540,278 | * | 9/1985 | Phillips .................................... 355/55 |
| 4,788,994 | * | 12/1988 | Shinbara ............................... 134/157 |
| 4,822,639 | * | 4/1989 | Fujii et al. ............................. 427/240 |
| 4,838,979 | * | 6/1989 | Nishida et al. ....................... 156/345 |
| 5,095,848 | * | 3/1992 | Ikeno ...................................... 118/53 |
| 5,209,180 | * | 5/1993 | Shoda et al. ............................ 118/52 |
| 5,395,446 |  | 3/1995 | Kageyama et al. .................... 118/52 |
| 5,426,057 |  | 6/1995 | Tamaoki ................................ 436/146 |
| 5,545,076 | * | 8/1996 | Yun et al. .............................. 451/287 |
| 5,608,943 | * | 3/1997 | Konishi et al. ......................... 15/302 |
| 5,706,843 | * | 1/1998 | Matsuo .................................. 134/153 |
| 5,718,763 | * | 2/1998 | Tateyama et al. ...................... 118/52 |
| 5,766,354 | * | 6/1998 | Ohmori et al. ....................... 118/319 |

FOREIGN PATENT DOCUMENTS

| | | |
|---|---|---|
| 0657924 | 6/1995 | (EP) . |
| 2272359 | 11/1990 | (JP) . |
| 03004166 | 1/1991 | (JP) . |
| 3239343 | 10/1991 | (JP) . |

* cited by examiner

*Primary Examiner*—Philip R. Coe
(74) *Attorney, Agent, or Firm*—Leydig, Voit & Mayer

(57) ABSTRACT

A method for recovering impurities on a surface of a silicon wafer includes a first step of using a pretreatment solution to decompose an oxide film, a nitride film on an oxynitridation film formed at a peripheral portion on a surface of a silicon wafer and to remove impurities on the peripheral portion and a second step of recovering impurities on the surface of the wafer expect for the peripheral portion.

4 Claims, 2 Drawing Sheets

Figure 1:
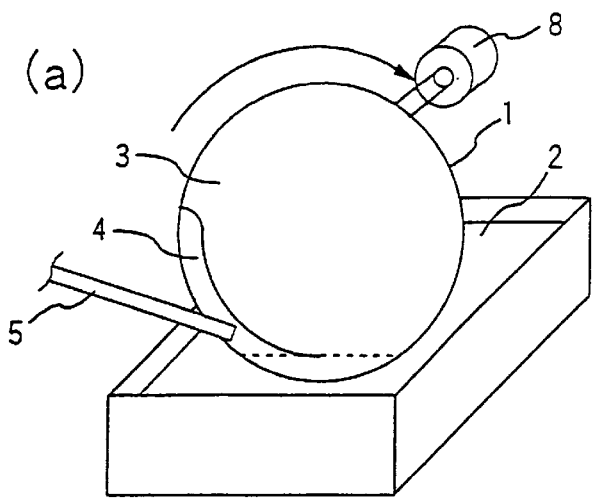
Figure 1:
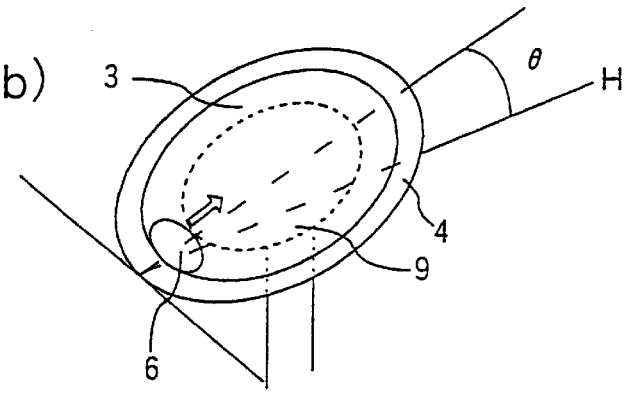
Figure 1:
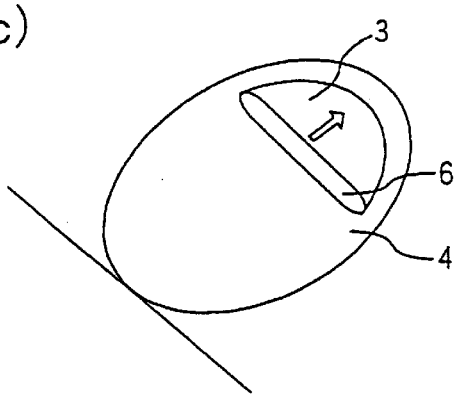
Figure 1:
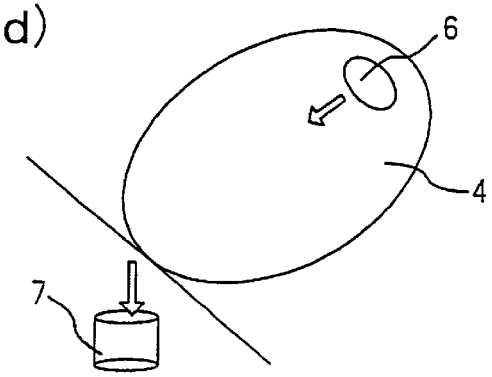

FIGURE 1 (b')
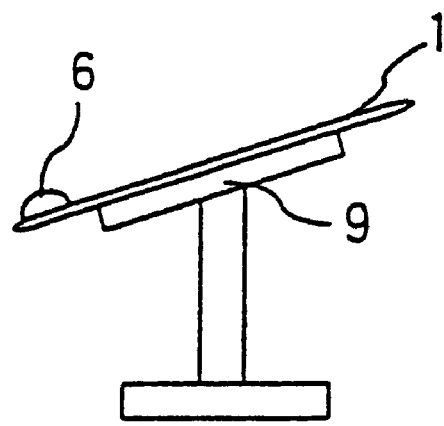

_US 6,182,675 B1_

APPARATUS FOR RECOVERING IMPURITIES FROM A SILICON WAFER

FIELD OF THE INVENTION

The present invention relates to a method and apparatus for recovering impurities on a silicon wafer.

BACKGROUND

In order to ensure good yield in a semiconductor fabrication process and the reliability of devices, it is indispensable to use a total clean-up technique throughout the fabrication process. This necessitates clean-up in fabrication steps and cleaning the surface of a wafer. One of control points necessary for cleaning the surface of a silicon wafer is the amount of metallic impurities. The metallic impurities on the silicon wafer are closely related to device characteristics. Metallic impurities can cause a junction leakage current to increase and the breakdown voltage of a gate oxide to degrade, and can have a significant effect on the reliability of devices.

In terms of the reliability of semiconductor devices and improvement in yield of semiconductor devices, it is extremely important that the amount of metallic impurities on a silicon wafer be analyzed with precision, and that the relationship between the amount of the metallic impurities and devices characteristics is determined.

As a method to determine the amount of metallic impurities on a semiconductor (Si) wafer with an oxide film ($SiO_2$), a method wherein impurities on the silicon wafer are decomposed by HF vapor or an HF solution and are collected, and then the amount of the respective impurities in the collected solution is determined with flameless atomic absorption spectrometry or inductively coupled plasma mass spectrometry has been proposed, for instance.

As a method for recovering impurities on a silicon wafer, there has been proposed vapor phase cracking wherein a silicon wafer with an oxide film and an HF solution are sealed in a sealed vessel to make the oxide film react with the HF vapor for a certain period of time so as to decompose impurities, and the reaction solution is recovered (JP-A-2192750 and JP-A-5283381).

If the silicon wafer is arranged in a vertical position in the vapor phase cracking, the reaction solution containing the impurities drips. The dripping solution can be automatically collected in a receiver for a reaction solution under the silicon wafer to recover the impurities on the entire surface of the silicon wafer ("Analytical Chemistry" Vol.37 page 215 (1998)).

If a silicon wafer has a naturally formed oxide film, a step for forming a thermal oxide film before decomposition by HF vapor is provided to make the formation of a dripping reaction solution easy for collecting the solution ("Extended Abstract of the 16th Conference on Solid State Devices and Materials" A. Shimazaki, H. Hiratsuka, Y. Matsushita and A. Yoshii p.281 1994). Or, if there is no step of forming the thermal oxide film, a small amount of ultrapure water or HF solution is dripped on a silicon wafer after decomposition by HF vapor, and the dripped solution is made to scan the entire surface of the silicon wafer to recover the impurities ("Analytical Chemistry" Vol.38 page 177, 1989).

There has been proposed liquid phase cracking wherein a small amount of HF solution is dripped on a silicon wafer with an oxide film thereon, the solution is left for a certain period of time to react with the oxide film on the entire surface of the silicon wafer so as to decompose impurities, and the reaction liquid which gathers at a single location on the silicon wafer is recovered by a micropipette (JP-A-2272359). If a silicon wafer has a naturally formed oxide film, an HF solution is made to scan the entire surface of the silicon wafer to decompose impurities, recovering the impurities (JP-A-3239343).

The principles and systems for the flameless atomic absorption spectrometry and inductively coupled plasma mass spectrometry are described in detail in articles such as "Furnace Atomic Absorption Spectrometry-determine an infinitesimal amount" pages 1–56, issued by Gakkai Shuppan Center and "Plasma Ion Source Mass Spectrometry" pages 13–43, issued by Gakkai Shuppan Center.

If impurities on a silicon wafer with an oxide film thereon are recovered, a dripped reaction solution can be automatically collected to recover the impurities from the entire surface of the silicon wafer in either an HF vapor recovery or an HF solution recovery.

However, if impurities on a silicon wafer with a naturally formed oxide film thereon are recovered, no dripped reaction solution is formed with HF vapor. Even if an HF solution is dripped, the dripped solution scatters, making recovery of the impurities difficult.

In order to cope with this problem, it is necessary to form a thermal oxide film to increase the thickness of the oxide film so as to make recovery of a dripped reaction solution easier. However, there is a possibility that additional contaminants may get mixed with the oxide film from an ambient gas or impurities are vaporized in a step for oxidation. If there is provided no step for thermal oxidation, it is necessary to make an HF solution or ultrapure water scan the entire surface of a silicon wafer to recover impurities. In this case, it is necessary to scan the surface of the silicon wafer from edge to edge, and recovering the impurities without making the dripped solution separate from the silicon wafer requires considerable practice. The time and the number of scans by the dripped solution vary from one portion to another portion on the wafer, making uniform recovery extremely difficult.

The impurities which should be included in the amount of impurities on a silicon wafer are impurities which have been originally included in a surface of the silicon wafer and contaminants which are typically received in the surface of the silicon wafer in a semiconductor fabrication process. Contaminants which are locally received in a peripheral portion of a silicon wafer by contact of the wafer with a transportation carrier or a pair of tweezers should not be included in the impurity analysis. However, there is a possibility that the analysis is carried out in such a way so as to include local impurities because the recovery is carried out in such a way to include the impurities on the surface of a silicon wafer at its peripheral portion where the wafer contacts with a transportation carrier or a pair of tweezers. Under the circumstances, it is presumed that a positive error is included in the analysis because of failure to obtain a determinative value as to the amount of impurities. It is difficult to carry out a quantitative analysis with sufficient precision.

SUMMARY OF THE INVENTION

It is an object in the present invention to resolve these problems, and to provide a method and an apparatus for recovering only impurities typically contained in a surface of a silicon wafer without recovering local contaminants at a peripheral portion on the surface of the silicon wafer as well as to provide a method and an apparatus for automatically collecting a dripped reaction solution without the need for scanning a dripped recovering solution for recovering impurities on a surface of a silicon wafer with an oxide film formed thereon.

According to a first aspect of the present invention, there is provided a method for recovering impurities on a surface of a silicon wafer which comprises a first step of using a pretreatment solution to decompose an oxide film, a nitride film or an oxynitridation film formed at a peripheral portion on a surface of a silicon wafer and to remove impurities on the peripheral portion; and a second step of recovering impurities on the surface of the wafer except for the peripheral portion.

According to a second aspect of the present invention, the first step includes immersing the peripheral portion of the wafer in the pretreatment solution, and rotating the wafer to decompose the oxide film, the nitride film or the oxynitridation film formed at the peripheral portion and to remove the impurities on the peripheral portion.

According to a third aspect of the present invention, a silicon wafer which has an oxide film, a nitride film or an oxynitridation film thereon is arranged in a slant position, an impurity recovering solution is dripped on a lower portion of the wafer, the oxide film, the nitride film or the oxynitridation film is decomposed by leaving the dripped solution for a certain period of time, and then impurities is recovered by collecting the dripped solution.

According to a fourth aspect of the present invention, the second step with respect to the first aspect includes arranging the wafer in a slant position; and decomposing the oxide film, the nitride film or the oxynitridation film on the surface of the wafer except for the peripheral portion and recovering the impurities by dripping an impurity recovering solution on a lower portion of the wafer and collecting the dripped solution after leaving the dripped solution for a certain period of time.

According to a fifth aspect of the present invention, the pretreatment solution is an HF solution having a concentration of 0.01–30 wt. %.

According to a sixth aspect of the present invention, the first step includes spraying a gas on the peripheral portion after immersion of the wafer, thereby carrying out drying.

According to a seventh aspect of the present invention, the second step includes arranging the wafer in a slant angle of 0.5°–30° with respect to a horizontal surface.

According to an eighth aspect of the present invention, there is provided an apparatus for recovering impurities on a surface of a silicon wafer, which comprises means for immersing a peripheral portion on a surface of a silicon wafer in a pretreatment solution, the silicon wafer having an oxide film, a nitride film or an oxynitridation film formed thereon; means for rotating the wafer with the peripheral portion thereof immersed in the pretreatment solution to decompose the oxide film, the nitride film or the oxynitridation film formed at the peripheral portion and to remove impurities on the peripheral portion; and means for collecting impurities on the surface of the wafer except for the peripheral portion.

According to a ninth aspect of the present invention, there is provided an apparatus for recovering impurities on a surface of a silicon wafer, which comprises means for arranging the wafer in a slant position, the wafer having an oxide film, a nitride film or an oxynitridation film formed thereon; means for dripping an impurity recovering solution on a lower portion of the wafer to decompose the oxide film, the nitride film or the oxynitridation film and to recover impurities on the surface of the wafer; and means for collecting the dripped solution. According to a tenth aspect of the present invention, there is provided an apparatus for recovering impurities on a surface of a silicon wafer, which comprises means for immersing a peripheral portion on a surface of a silicon wafer in a pretreatment solution, the silicon wafer having an oxide film, a nitride film or an oxynitridation film formed thereon;

means for rotating the wafer with the peripheral portion thereof immersed in the pretreatment solution to decompose the oxide film, the nitride film or the oxynitridation film formed at the peripheral portion to remove impurities on the peripheral portion; and means for collecting impurities on the surface of the wafer except for the peripheral portion; means for decomposing the oxide film, the nitride film or the oxynitridation film at the peripheral portion and arranging the wafer with the impurities at the peripheral portion removed, in a slant position; means for dripping an impurity recovering solution on a lower portion of the wafer to decompose the oxide film, the nitride film or the oxynitridation film on the surface of the wafer except for the peripheral portion and to recover the impurities on the surface of the wafer except for the peripheral portion; and means for collecting the dripped solution.

In accordance with the first aspect, a dripped impurity recovering solution can be prevented from invading the peripheral portion of the surface of the silicon wafer. The dripped solution after reaction can be prevented from scattering in recovering the impurities on the surface of the wafer except for the peripheral portion in recovering the impurities, thereby ensuring easy recovery. The local contaminants at the peripheral portion are prevented from being collected, and only the impurities which are typically included in the surface of the silicon wafer are collected, thereby improving the degree of accuracy of an analysis value.

In accordance with the second aspect, the film at the peripheral portion is easily decomposed and the impurities on the peripheral portion are removed. In addition, a dripped impurity recovering solution can be prevented from invading the peripheral portion of the surface of the silicon wafer and the dripped solution after reaction can be prevented from dispersing when recovering the impurities on the surface of the wafer, thereby ensuring easy recovery. The local contaminants at the peripheral portion are prevented from being collected, and only the impurities which are typically included in the surface of the silicon wafer are collected, thereby improving the degree of accuracy of an analysis value.

According to the third aspect, it is possible to control a time required for reaction with the impurity recovering solution, facilitating equal and sufficient recovery on the surface of the silicon wafer. Since the dripped solution after reaction can automatically gather at a single portion on the silicon wafer in a certain period of time, the recovery by scanning the dripped solution is not necessary, facilitating the recovering operation and improving the degree of accuracy of an analysis value.

In accordance with the fourth aspect, uniform and sufficient recovery on the surface of the silicon wafer is easy, and the degree of accuracy of an analysis value is improved.

In accordance with the fifth aspect, the method is carried out effectively and efficiently, so that the oxide film, the nitride film or the oxynitridation film formed at the peripheral portion on the surface of the silicon wafer can be decomposed and the impurities on the peripheral portion are removed.

In accordance with the sixth aspect, the pretreatment solution can be prevented from invading the surface of the silicon wafer except for the peripheral portion when the oxide film, the nitride film or the oxynitridation film at the peripheral portion is decomposed. As a result, the area of the impurity recovering surface can be kept constant, further improving the precision of an analysis value.

In accordance with the seventh aspect, the impurity recovering solution which is dripped on the lower portion of the wafer easily move upward, and the dripped solution which has recovered the impurity can slide down on the wafer.

In accordance with the eighth aspect, the dripped solution for impurity recovery can be prevented from invading the peripheral portion of the wafer and the dripped solution after reaction can be prevented from dispersing during impurity recovery, thereby ensuring easy recovery. The local contaminants on the peripheral portion are prevented from being collected, and only the impurities which are typically included in the surface of the silicon wafer are collected, improving the degree of accuracy of an analysis value.

In accordance with the ninth aspect, it is possible to control the time for reaction with the impurity recovering solution, facilitating uniform and sufficient recovery on the surface of the silicon wafer. Since the dripped solution after reaction automatically gathers at a single portion of the silicon wafer, the recovery by scanning the dripped solution is not necessary, facilitating the recovering operation and improving the degree of accuracy of an analysis value.

In accordance with the tenth aspect, it is easy to carry out uniform and sufficient recovery on the surface of the silicon wafer, and it is possible to improve the degree of accuracy of an analysis value.

BRIEF DESCRIPTION OF DRAWING FIGURES

FIGS. 1(*a*), 1(*b*), 1(*c*) and 1(*d*) are views of the impurity recovering method according to an embodiment of the present invention wherein recovery steps are shown in the order thereon; and FIG. 1(*b'*) is a side view of an example of the supporter according to the present invention.

Now, the present invention will be described in detail, by reference to preferred embodiments.

EMBODIMENT 1

In the method and the apparatus for recovering impurities on a surface of a silicon wafer according to a first embodiment of the present invention, a peripheral portion of a silicon wafer which has an oxide film formed thereon is immersed in a pretreatment solution, the silicon wafer is rotated to decompose the oxide film at the peripheral portion and to remove impurities on the peripheral portion. Then, impurities on the surface of the silicon wafer except for the peripheral edge are recovered. Since the decomposition of the oxide film at the peripheral portion of the silicon wafer by the pretreatment solution causes the peripheral portion of the wafer to become a surface capable of repelling an impurity recovery solution, a dripping solution for impurity recovery can be prevented from invading the peripheral portion of the wafer. The dripping solution after reaction can be prevented from scattering in collecting the impurities on the surface of the wafer except for the peripheral portion thereon, thereby ensuring easy recovery. Contaminants localized on the peripheral portion are not collected, and only impurities which are typically included in the surface of the silicon wafer are collected, improving the degree of accuracy of an analysis value.

As a method for recovering the impurity on the surface except for the peripheral portion, there are e.g., a method, wherein recovering is carried out by collecting a dipping solution on the surface with a micropipette after decomposition due to HF vapor, a method wherein recovery is carried out by scanning of a small amount of ultrapure water dripping after decomposition due to HF vapor, a method wherein a small amount of HF solution is dripped, the solution is left for a while and the dripped solution after reaction which gathers at a single portion on a silicon wafer is collected by a micropipette, and a method wherein recovery is carried out by scanning of a dipped HF solution, as stated with respect to the prior art.

The pretreatment solution which has adhered on the peripheral portion of the silicon wafer after immersion as the wafer is rotated is dried by spraying a gas to prevent the pretreatment solution from invading the surface on the wafer except for the peripheral portion during decomposition of the oxide film at the peripheral portion. This keeps the area of an impurity recovering surface constant and further improves the precision of an analysis value. When an inert gas is used as the spraying gas, there is no possibility that the spaying gas reacts with the pretreatment solution and so on.

The pretreatment solution may be, e.g., an HF solution having a concentration 0.01–30 wt. % (preferably 0.1–30 wt. %). If the concentration is beyond 30 wt. %, a central portion of the wafer to recover the impurities is also decomposed. If the concentration is below 0.01 wt. %, the time for pretreatment can become long.

EMBODIMENT 2

In the method and the apparatus for recovering impurities on a surface of a silicon wafer according to a second embodiment of the present invention, the silicon wafer which has an oxide film formed thereon is arranged in a slant position. An impurity recovering solution is dripped on a lower portion of the wafer, and decomposition of the oxide film and recovery of impurities on the surface are carried out by collecting the dripped solution after leaving it for a certain period of time. The slant arrangement of the silicon wafer in recovering the impurities allows the time for reaction with the impurity recovering solution to be controlled. The dripping of the impurity recovering solution on the lower portion allows the dripped solution to move upward, facilitating uniform and sufficient recovery on the surface of the silicon wafer. Since the dripped solution after reaction automatically gathers at a single portion on an upper portion of the silicon wafer after a certain period of time, recovery by scanning of the dripped solution becomes unnecessary, making the recovery operation easy and improving the degree of accuracy of an analysis value.

Since the silicon wafer is slanted during collecting the impurity recovering solution, a recovery vessel which is arranged under the wafer can receive the dripped solution by dripping thereof from the wafer. As a result, the contamination during transportation of the recovering solution from the wafer to the recovery vessel can be minimized, further improving the precision of an analysis value.

If a peripheral portion on the surface of the silicon wafer is pretreated so as to repel the impurity recovering solution, the dripped impurity recovering solution can be prevented from invading the peripheral portion and the dripped solution after reaction can be prevented from scattering during impurity recovery, further ensuring easy recovery. The contaminants localized on the peripheral portion can be prevented from being collected, and only the impurities which are typically included in the surface of the silicon wafer are collected, further improving the degree of accuracy of an analysis value.

The impurity recovering solution may be, e.g., an HF solution having a concentration of from 0.01 wt. % to 30 wt.

% (preferably from 0.05 wt. % to 3 wt. %) with from 0.01 wt. % to 30 wt. % of $H_2O_2$ or $HNO_3$ incorporated therein, an HF solution with $H_2SO_4$ or HCl incorporated therein. If the incorporation of HF is beyond 30 wt. %, the dripped solution scatters and fails to gather at a single portion on the wafer. If the incorporation of HF is below 0.01 wt. %, the recovery does not progress because the dripped solution for recovery fails to decompose the oxide film.

The slant angle of the silicon wafer may be from 0.5° to 30° with respect to a horizontal surface, preferably from 2° to 10°. If the slant angle is greater than 30°, the solution dripped on the lower portion becomes difficult to climb up the wafer. If the slant angle is smaller than 0.5°, the solution which has recovered the impurities becomes difficult to slide down on and fall off of the wafer.

EMBODIMENT 3

In the method and the apparatus for recovering impurities on a surface of a silicon wafer according to a third embodiment of the present invention, a peripheral portion of a silicon wafer which has an oxide film formed thereon is immersed in a pretreatment solution, the silicon wafer is rotated to decompose the oxide film at the peripheral portion and to remove impurities on the peripheral portion. The silicon wafer is arranged in a slant position, an impurity recovering solution is dripped on a lower portion of the wafer, and decomposition of the oxide film and recovery of impurities on the surface except for peripheral portion are carried out by the dripping of the impurity recovering solution on such a lower portion of the wafer and collecting the dripped solution after leaving the dripped solution for a certain period of time. Since the decomposition of the oxide film at the peripheral portion by the pretreatment solution causes the peripheral portion of the wafer to become a surface to repel the impurity recovering solution, the impurity recovering solution can be prevented from invading the peripheral portion and the dripped solution after reaction can be prevented from scattering. Since the dripped solution automatically gathers at a single portion on the wafer in a certain period of time, the recovery by scanning of the dripped liquid becomes unnecessary, facilitating the recovery operation. The slant arrangement of the silicon wafer during impurity recovery allows for a required reaction time with the impurity recovering solution to be controlled, facilitating uniform and sufficient recovery on the surface of the silicon wafer. The recovery requires no practice. Since the scanning of the dripped solution in the recovery operation for the impurities is not necessary, the degree of accuracy of an analysis value is improved. Because the oxide film at the peripheral portion on the surface of the silicon wafer is decomposed, the impurity recovering solution can be prevented from invading the peripheral portion. As a result, the contaminants localized on the peripheral portion are not collected, and only the impurities which are typically included in the surface of the silicon wafer are collected, further improving the degree of accuracy of an analysis value.

In this manner, only the typical impurities except for the localized contaminants can be automatically collected, thereby making the recovery method and apparatus applicable to a silicon wafer having a naturally formed oxide film thereon, which has been difficult in the prior art.

The pretreatment solution which has adhered on the peripheral portion of the wafer after immersion as the wafer is rotated is dried by spraying a gas to prevent the pretreatment solution from invading the surface of the silicon wafer except for the peripheral portion thereof during decomposition of the oxide film at the peripheral portion, thereby keeping the area of an impurity recovering surface constant and further improving the precision of an analysis value. If an inert gas is used as the spray gas, there is no possibility that the spray gas reacts with the pretreatment solution.

A recovery vessel which is arranged under the wafer can receive the dripped solution for collecting the impurity recovering solution by making use of dripping thereof from the silicon wafer. As a result, the contamination during transportation of the recovering solution from the wafer to the recovery vessel can be minimized, further improving the precision of an analysis value.

The pretreatment solution and the impurity recovering solution may be the same as those of the first embodiment and the second embodiment.

The slant angle of the silicon wafer may be the same as that of the second embodiment.

EMBODIMENT 4

Although explanation of the first through third embodiments has been made with respect to the silicon wafer which has the oxide film (e.g., $SiO_2$) formed thereon, the present invention is applicable to a silicon wafer which has a nitride film (e.g., $Si_3N_4$) or an oxynitridation film (e.g., SiNO) formed thereon. In such case, the impurity recovering solution may be an HF solution with e.g., $HNO_3$ or $H_2O_2$ incorporated therein as in the previous embodiments, and the pretreatment solution may be e.g., an HF solution as in the previous embodiments.

EXAMPLE

A specific example of the method and apparatus for recovering impurities on a surface of a silicon wafer according to the present invention will be described with reference to the accompanying drawing.

First, a clean silicon wafer which has a diameter of 6 inches and has a naturally formed oxide film ($SiO_2$) thereon was prepared. 1 ml of a solution containing 10 ppb of Na, Al, Fe and Cu was dripped on the wafer. The dripped solution spread over a central portion of the wafer except for the peripheral portion thereof to spread Na, Al, Fe and Cu in the solution on the wafer in an equal way. These materials dried by themselves. In that manner, a predetermined amount of contamination treatment was carried out.

In FIGS. 1(a)–1(d) are shown the process in the method for recovering impurities on a surface of a silicon wafer according to the example. In these Figures, reference numeral 1 designates the silicon wafer, reference numeral 2 designates an HF solution of a concentration of 1 wt. % as the pretreatment solution, reference numeral 3 designates the naturally formed film ($SiO_2$) which was formed on the silicon wafer 1 and has a thickness of about 20 Angstroms, reference numeral 4 designates a modified surface (Si surface), reference numeral 5 designates a gas spraying nozzle, reference numeral 6 designates a solution of 0.5 wt. % of HF/1 wt. % of $H_2O_2$ as the impurity recovering solution, reference numeral 7 designates a recovery vessel, and reference numeral 8 designates an electric motor.

Now, the processes will be explained referring to these Figures.

First, as shown in FIG. 1(a), a peripheral portion of the silicon wafer 1 which has the naturally formed oxide film 3 thereon is immersed in the 1 wt. % of HF solution 2. The silicon wafer 1 had a rear surface chucked to connect to the motor 8, and the silicon wafer was rotated by the motor to decompose and remove the naturally formed oxide film 3 on the peripheral portion of the silicon wafer along the entire circumference thereof. The HF solution on the modified surface (Si surface) 4 on the peripheral portion of the silicon wafer was dried by spraying nitrogen gas from the gas spraying nozzle 5, thereby preventing the HF solution from invading the surface of the wafer except for the peripheral portion thereon.

Next, as shown in FIG. 1(b), the silicon wafer 1 with a surface facing upward was arranged so as to be slanted at about 4°(θ) with respect to a horizontal surface H, and then 1 ml of the solution 6 containing 0.5 wt. % HF/1 wt. % of $H_2O_2$ as the impurity recovering solution was dripped on a lower portion on the surface of the wafer 1 except for the peripheral portion thereof, which had the naturally formed oxide film 3 thereon. In FIG. 1(b), reference numeral 9 designates a supporter which holds the wafer in a slant position. The supporter is omitted in FIGS. 1(c) and 1(d) for simplification. In FIG. 1(b') is shown a side view of an example of the supporter 9.

As the dripped solution 6 was decomposing the naturally formed oxide film 3, the dripped solution changed into a stripe form as shown in FIG. 1(c), the dripped solution arrived at an upper end of the surface of the wafer 1 except for the peripheral portion thereof as indicated by an arrow in this Figure, and the dripped solution completed recovery of the impurities. The time required to do that was about 5 minutes.

As shown in FIG. 1(d), the recovering dripped solution 6 slides down on the wafer from the upper end to a lower portion thereon as indicated by the arrow, and the dripped solution was collected into a sample bottle 7 for analysis, which was arranged under the wafer 1 as a recovery vessel.

The amount of each of the impurities in the collected solution was determined in quantitative analysis in a flameless atomic absorption spectrometry system.

The same processes as those just stated above were carried out to a silicon wafer 1 as a reference sample which was not subjected to contamination treatment.

Table 1 shows the recovery ratio of each of the metallic elements, which was found by comparing the original amount of each of the metallic elements after contamination treatment with a value which was obtained by subtracting a blank value of the reference sample from the determination value of each of the metallic elements collected and determined as explained above.

TABLE 1

| Metallic element | Recovery ratio (%) |
| --- | --- |
| Na | 100 |
| Al | 99 |
| Fe | 99 |
| Cu | 98 |

As clearly seen from Table 1, the contaminating metallic elements were recovered at a high recovery ratio, and the contaminated metallic elements were determined with high precision.

What is claimed is:

1. An apparatus for recovering impurities from a central portion of a surface of a wafer comprising:

means for immersing only a peripheral portion of a surface of a wafer in a first liquid;

means for rotating the wafer with only the peripheral portion of the surface immersed in the first liquid;

means for mounting the wafer, after removal of the peripheral portion from the first liquid, with the surface in an oblique orientation;

means for dripping a second liquid onto a central portion of the surface of the wafer; and means for collecting the second liquid dripping from an edge of the surface of the semiconductor wafer.

2. The apparatus of claim 1 further including a nozzle for discharging a gas for drying the peripheral portion of the wafer after immersion of the peripheral portion of the wafer in the first liquid and before mounting of the wafer with the surface in an oblique orientation.

3. The apparatus of claim 1 wherein the means for immersing includes a chuck for holding the semiconductor wafer in an oblique position relative to a vessel containing the first liquid.

4. The apparatus according to claim 3 wherein the means for rotating the wafer includes an electric motor for rotating the chuck.

* * * * *